United States Patent [19]

Rhee

[11] 4,128,849
[45] Dec. 5, 1978

[54] SELECTIVELY COUPLED SYNTHESIZER FOR TUNER OF TV RECEIVER

[75] Inventor: Dennis W. Rhee, Palatine, Ill.

[73] Assignee: Admiral Corporation, Schaumburg, Ill.

[21] Appl. No.: 689,660

[22] Filed: May 24, 1976

[51] Int. Cl.$^2$ .................. H04N 5/44; H04N 5/50; H04N 5/21; H04N 1/16
[52] U.S. Cl. .................. 358/191; 358/195; 358/167; 325/464; 325/468; 334/15
[58] Field of Search .................. 325/418-423, 325/455, 464, 468-470; 358/191, 192, 195, 167, 36; 334/14-16

[56] References Cited

U.S. PATENT DOCUMENTS

| | | | |
|---|---|---|---|
| 3,632,864 | 1/1972 | Evans | 358/195 |
| 3,902,121 | 8/1975 | Yoshino et al. | 325/420 X |
| 3,934,191 | 1/1976 | Garskamp | 325/422 |
| 3,949,158 | 4/1976 | Rzeszewski | 358/195 |
| 3,965,423 | 6/1976 | Fish, Jr. et al. | 325/420 |
| 3,973,228 | 8/1976 | Mueller et al. | 325/468 X |
| 3,980,951 | 9/1976 | Breeze et al. | 325/464 |
| 4,009,439 | 2/1977 | Rast | 325/468 |
| 4,025,953 | 5/1977 | Sideris | 358/191 |
| 4,038,689 | 7/1977 | Rzesewski et al. | 358/195 |
| 4,041,535 | 8/1977 | Rzesewki et al. | 358/191 |

OTHER PUBLICATIONS

*A Frequency Synthesizer for Television Receivers;* Breeze et al, Transactions BTR, Nov. 1974, pp. 259-263.
Hilliker; *Simplified TV Tuning System;* IEEE Transactions, Consumer Electronics, Feb. 1976.

*Primary Examiner*—John C. Martin
*Assistant Examiner*—Aristotelis M. Psitos
*Attorney, Agent, or Firm*—R. Lewis Gable; Albert G. Marriott

[57] ABSTRACT

A television receiver is disclosed including a varactor-type tuner selectively coupled to a synthesizer. Illustratively, the synthesizer includes a keyboard for selecting the desired channel within the UHF or VHF band, a channel memory for receiving and storing the selected channel and a programmable divider which divides selectively the output of the tuner's local oscillator in accordance with the selected channel to generate and apply its output to a phase comparator. The output of a reference oscillator also is applied to the phase comparator, whereby the output of the programmable divider is mixed therewith to obtain a tuning voltage to be applied to the tuner, which is associated with an automatic fine-tuning circuit (AFT); the AFT is adapted to be detuned selectively to increase the amplitude of the picture carrier signal and therefore, enhance the quality of the displayed images for weak signals, such as received from distant stations.

11 Claims, 13 Drawing Figures

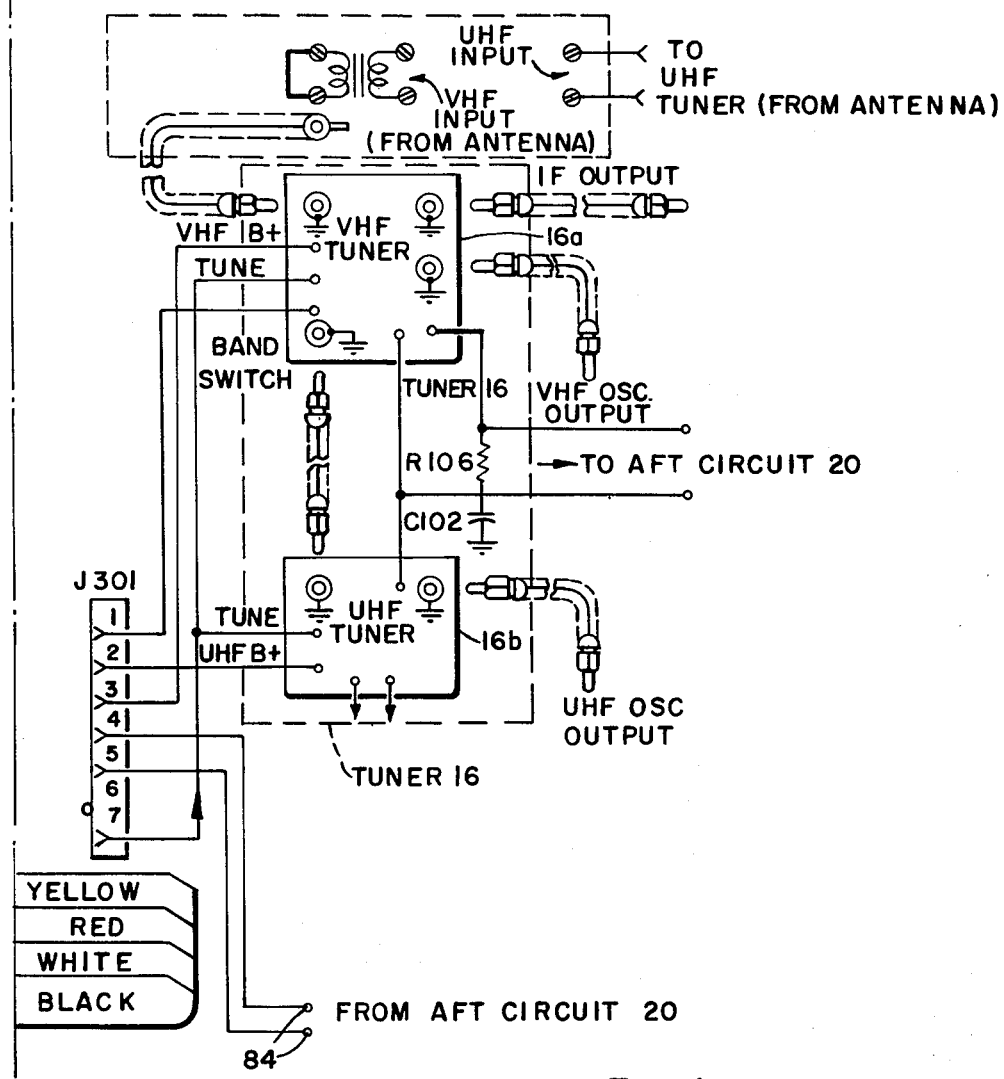

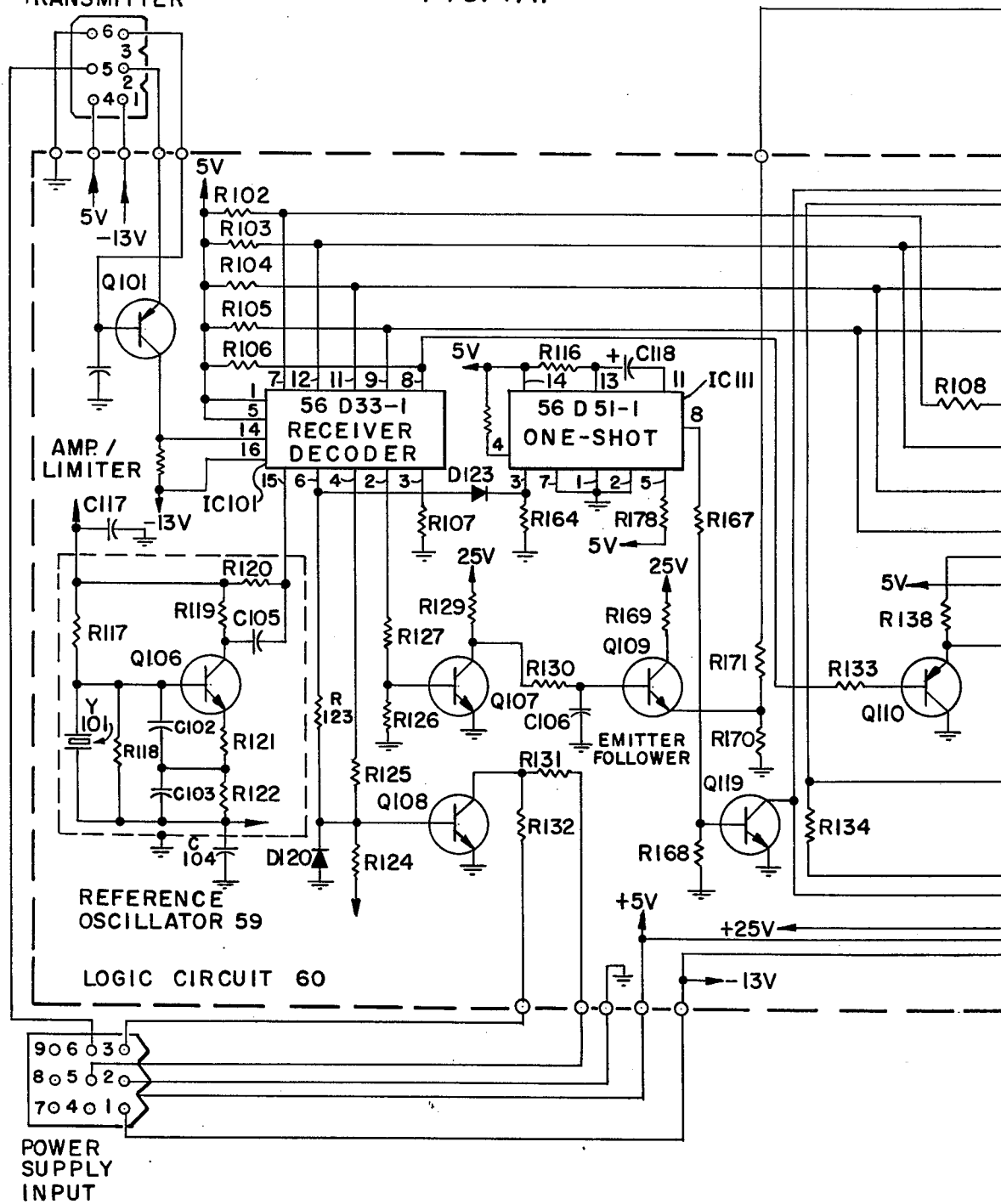

SELECTIVELY COUPLED SYNTHESIZER FOR TUNER OF TV RECEIVER

BACKGROUND OF THE INVENTION

1. Field of the Invention

The present invention relates to television receivers and in particular to means or circuits for selecting a channel of a varactor type.

2. Description of the Prior Art

Varactor-type tuning circuits are well-known in the art and particularly have been adopted for tuning tuners including both UHF and VHF sections. Such tuning circuits incorporate a varactor diode whose capacitance is dependent upon a tuning voltage applied thereto. The amplitude of the tuning voltage is determined selectively to set the channel to which the tuner is to be tuned.

There are known methods of developing such tuning voltages, including the so-called automatic tuning in which a sweep is stopped when a predetermined intermediate-frequency signal is produced by applying voltages to the varactor diode from a voltage sweep circuit. Although this method makes the digital display of selected channels possible, it is disadvantageous in being unstable since the sweep can stop due to voice carrier waves and since a particular one of the receiving channels can change to another on account of interruption or weakness of the incoming electric waves.

Channel selecting apparatus has therefore been contrived in which two local oscillators, each adapted to operate with the frequency swept by sweep voltages, are provided. The two local oscillators are so set to alternately conduct the sweep initiation and the sweep termination; the frequency interval between the sweep initiation and the corresponding sweep termination is made equal to the channel frequency interval. The alternate sweep operations are started from the carrier frequency of the lowest frequency channel of a broadcasting band, and the number of times of the sweep initiations or terminations is counted to detect that the aforesaid operations have been carried out by a desired number of times. The sweep of the concerned one of the local oscillators is stopped upon detection, and then the sweep voltage at the stop is stored, to receive the desired broadcast. Such a varactor tuning circuit is described in U.S. Pat. No. 3,822,405.

Alternatively, the tuning voltage may be derived from a synthesizer circuit including a keyboard which the operator sets in accordance with the desired channel, to provide a signal to be stored within a channel memory. Illustratively, the output of the channel memory indicative of the channel to be tuned may be displayed upon a suitable display and also applied to a variable, programmable divider. The programmable divider selectively divides the output of a local oscillator within the varactor tuner to be compared with the output of a reference oscillator. A phase comparator mixes the reference output oscillator output and the output of the programmable divider to provide a variable, tuning voltage to be applied to the varactor-type tuner. One of the disadvantages of such channel-selecting circuitry is that the programmable divider uses a series of counters to achieve the division of the local oscillator output, which typically is of a high frequency. In the division process, relatively high-frequency radiation emanates from the programmable divider. Typically, where UHF and VHF signals are being tuned, these frequencies are in the order of about 50 MHz to about 920 MHz. Radiation of such frequencies is sensed by the receiver's antenna to impose extraneous signals upon the video signal, which cause distortion of the displayed image. In a color receiver, this distortion is displayed upon the CRT as an interference pattern of lines and dots. Further, it is understood that such high-frequency radiation may provide radiation to other, neighboring TV receivers, distorting the display of these other TV receivers.

In a further aspect of the TV receiver tuner operation, it is normal to incorporate an automatic fine-tuning circuit (AFT) in connection with the tuner to correct for slight drifting of the tuned signal, and in particular, to develop an error signal to shift the detected signal back toward the correct frequency. In typical television transmission, the picture carrier is set at 45.75 MHz, and as seen in FIG. 5, the output of the IF amplifier at a frequency of 45.75 MHz, is down 6 dB from its output at 44 MHz. Thus, it is seen that in tuning distant stations, the received signal may be otherwise too weak to produce an acceptable picture. In accordance with the objects of this invention, the AFT circuit is detuned slightly to shift the output of the IF amplifier toward the frequency of 44 MHz, whereby the amplitude of the picture carrier signal is increased to enhance the displayed picture.

SUMMARY OF THE INVENTION

It is therefore an object of this invention to provide a new and improved varactor-type tuning circuit selectively coupled to a synthesizer circuit that is operated in a manner to reduce the generation of high-frequency radiation therefrom.

It is a still further object of this invention to provide a new and improved varactor-type tuning circuit including an automatic fine-tuning circuit that may be detuned slightly to achieve increased picture carrier signal strength.

In accordance with these and other objects of this invention, there is provided a varactor-type tuning circuit for a TV receiver including a synthesizer selectively coupled during an initial period of operation to apply a tuning voltage to a varactor-type tuning circuit, and thereafter, the tuning voltage as developed by an automatic fine-tuning circuit is applied thereto. In an illustrative embodiment of this invention, the synthesizer circuit comprises a keyboard, upon which the desired channel is selected to be stored within a channel memory. The output of the channel memory controls a programmable divider to divide the output of the tuner's local oscillator by a factor in accordance with the selected channel. The output of the programmable divider is phase-compared or mixed with the output of a reference oscillator to provide the desired tuning voltage. In operation, the synthesizer is actuated selectively for the relatively short, initial period of operation to develop the tuning voltage in accordance with the desired channel. Once the tuner has been tuned such that the desired channel has been selected, the automatic fine-tuning (AFT) circuit is coupled to place a corresponding tuning voltage upon the tuner. Selectively-actuated switch means is responsible to energize the synthesizer or the AFT circuit which is operatively connected to the tuning circuit for the aforementioned periods of operation.

In a further aspect of this invention, the AFT circuit associated with the varactor-type tuner is connected with a detuning circuit, whereby the correction output of the AFT circuit is adjusted slightly, i.e. to shift the frequency tuned by the varactor-type diode, such that the picture carrier signal, nominally at a frequency of 45.75 MHz, is shifted toward a frequency of 44 MHz, and, as a result, the amplitude of the IF amplifier output is increased to improve the quality of the displayed image. The detuning circuit may illustratively include a varactor-type diode to be coupled with the AFT circuit by an appropriate switching means when it is desired to detune the AFT circuit.

BRIEF DESCRIPTION OF THE DRAWINGS

These and other objects and advantages of the present invention will become more apparent by referring to the following detailed description and accompanying drawings, in which:

FIGS. 4A-4H show schematic, detailed circuitry of the synthesizer circuit and logic circuit as shown in FIG. 1, and FIG. 4 shows the manner in which FIGS. 4A-4H are assembled.

DETAILED DESCRIPTION OF THE PREFERRED EMBODIMENTS

Figure 1:
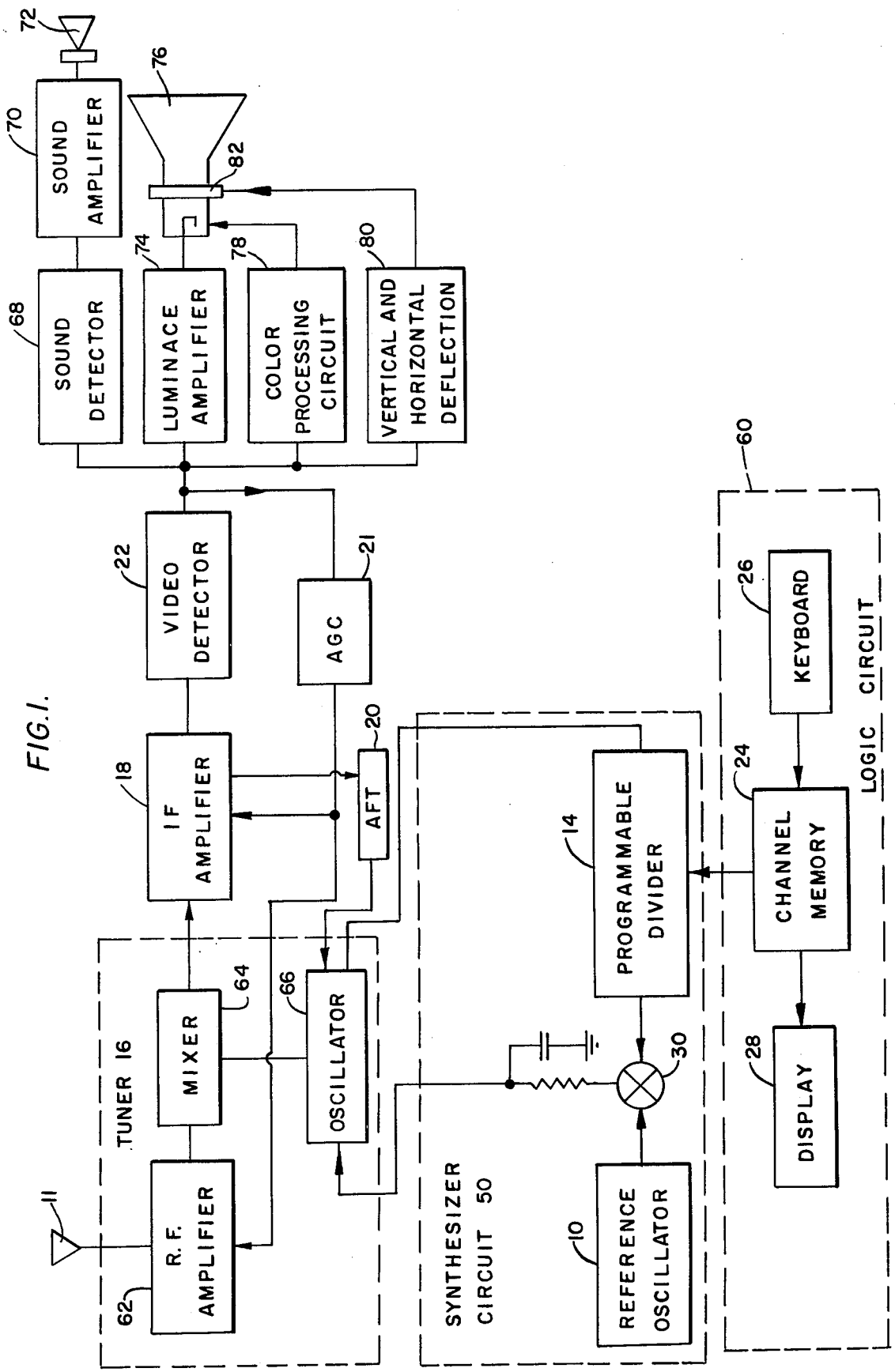
FIG. 1 is a block diagram of a television receiver including the varactor-type tuner and synthesizer in accordance with the teachings of this invention.

With reference to the drawings and in particular to FIG. 1, there is shown a color television receiver into which a synthesizer circuit 50 and a logic circuit 60, in accordance with the teachings of this invention, have been incorporated. The color television receiver includes an antenna 11 coupled to a tuner 16, and in particular to an RF amplifier 62 thereof for amplifying the receiver signal to be applied to one input of a mixer 64 to be mixed with the output of a local oscillator 66. In turn, the output of the tuner 16 and in particular its mixer 64, is applied to an IF amplifier 18, and thereafter to a video detector 22. The video detector output is applied to a conventional automatic gain control (AGC) circuit 21, whose output is applied to the IF amplifier 18 and to the tuner 16. The output of the video detector 22 is applied also to a luminance amplifier 74, the output of which controls a representation of monochrome or brightness information as applied to the cathode element of a cathode ray tube (CRT) 76. Further, the output of the video detector 22 also is applied to a vertical and horizontal deflection circuit 80 whereby suitable vertical and horizontal deflection signals are applied to a yoke 82 disposed about the envelope of a cathode ray tube 76. In addition, the video detector output is applied to a sound channel comprised of a sound detector 68 whose output is amplified by a sound amplifier 70 before being applied to a loudspeaker 72. Further, the output of the video detector 22 is applied to a color processing circuit 78, whereby the appropriate red, green and blue signals are developed and applied to the respective electron guns of the color cathode ray tube 76.

Figure 2:
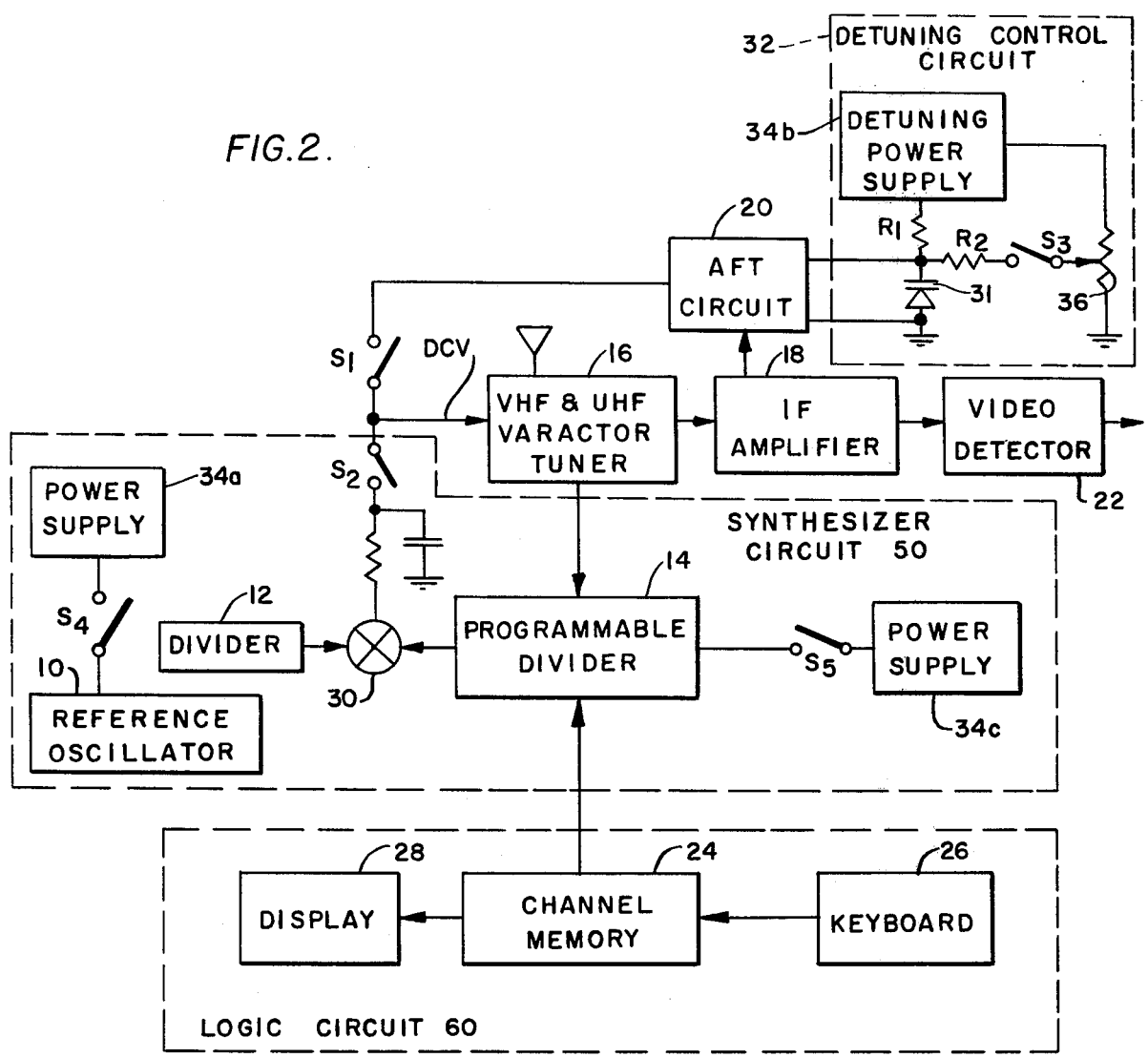
FIG. 2 is a simplified block diagram of the varactor tuner and synthesizer circuit in accordance with the teachings of this invention and further shows a detuning control circuit in accordance with a further aspect of this invention.

Continuing now the description with respect to FIGS. 1 and 2, the synthesizer circuit 50 includes a reference oscillator 10 for providing a substantially constant output signal of 4 MHz, to be applied via a divider 12, whereby the oscillator output signal is divided by a fixed factor to be applied to a phase comparator or mixer 30. A further input is applied to the phase comparator 30 from a programmable divider 14, comprised, as will be explained in greater detail later, of a plurality of dividers and a readonly memory (ROM), whereby the programmable divider 14 is selectively set to provide an input signal thereto by a factor dependent upon the selected TV channel to be tuned. The particular channel to be tuned is set by a logic circuit 60 comprised of a keyboard 26, upon which the viewer/operator selects the channel to be tuned, and whose output indicative of the channel to be tuned is applied to a channel memory 24. The memory 24 stores the selected channel, and applies its outputs to a display 28 whereby the selected channel is visually displayed and also to the programmable divider 14 to determine the factor by which the output of the oscillator 66 is divided selectively in accordance with the selected channel. The programmable divider output in turn is phase-compared with the divided, reference oscillator output to provide the tuning signal, typically a DC voltage signal, of an amplitude determined in accordance with the channel to be tuned by the tuner 16. As shown in FIG. 2, the synthesizer circuit 50 further includes suitable power supplies 34a and 34c, selectively coupled by switches S4 and S5, respectively, to the reference oscillator 10 and to the programmable divider 14. The output of the phase comparator 30 is applied selectively for an initial period of operation, as will be explained later in detail, by a switch S2 to the VHF and UHF varactor tuner 16. As shown particularly in FIG. 1, the output of the phase comparator 30 is applied to the oscillator 66 of the tuner 16.

In operation, the viewer selects the desired channel to be tuned by entering an appropriate number upon the keyboard 26. At this time, a signal is developed, as will be explained in detail, whereby the switches S4, S5 and S2 are effectively closed or made operative. It is understood that the switches S2, S4 and S5 are electronic switches and are actuated or closed during the initial period of operation, illustratively 300 ms. It is understood that during this initial period of operation, switch S1 remains open, whereby the tuning voltage is derived solely from the synthesizer circuit 50. During the subsequent period of operation, the switches S2, S4 and S5 are open and the switch S1 is closed, and the tuning voltage of the tuner 16 is maintained by the output of the AFT circuit 20 through the closed switch S1 to the VHF and UHF varactor tuner 16.

In the initial operating period, the stored channel selection signal is applied to the programmable divider 14, which is decoded by the ROM thereof to set the factor by which the output of the oscillator 66 is divided. As indicated in FIG. 2, the programmable divider 14 is capable of dividing the oscillator output by a variable factor. The divider output and the reference oscillator output are mixed or compared by the comparator 30 to develop the DC signal indicative of the desired channel to which the tuner 16 is to be tuned. After the initial period of operation, the switches S2, S4 and S5 are opened and the switch S1 is closed. At this time, the varactor-type tuner 16 has been tuned selectively to provide an output successively through the IF amplifier 18 and video detector 22. As seen in FIG. 2, the output of the IF amplifier 18 also is applied to the AFT circuit 20 which develops a fine-tuning signal whereby the precise-tuned frequency of the tuner 16 is prevented from drifting. In accordance with teachings of this invention, the AFT circuit 20 continues to provide during this subsequent period of operation, a DC voltage indicative of the desired channel to which the varactor-type tuner 16 is to be tuned.

With reference specifically to FIGS. 1 and 2, there is shown a detuning circuit 32 and its relationship to the automatic fine-tuning circuit 20. As shown, a varactor diode 31 is connected in-parallel with the tuning elements of the AFT circuit 20, the AFT circuit 20 being otherwise of conventional design. A power supply 34b is connected through a resistor R1 to a first terminal of the varactor diode 31, the remaining portion of the energizing circuit being completed by a variable potentiometer 36 connected between the power supply 34b and ground. The tap of the variable potentiometer 36 is connected selectively by a switch S3 via a resistor R2 to a terminal of the varactor diode 31. During normal operation, a first potential, as determined by the value of the resistor R1 and the internal DC impedance of the AFT circuit 20, is applied across the varactor diode 31, whereby a first potential is applied to the varactor diode 31, which then applies a fixed, corresponding capacitance in-parallel with the AFT circuit 20. If it is desired to detune the AFT circuit 20 slightly, the switch S3 is closed, whereby a variable potential as established by the setting of the tap of the variable potentiometer 36, is applied to the varactor diode 31, whereby its capacitance is set selectively to provide the desired degree of detuning.

Figure 5:
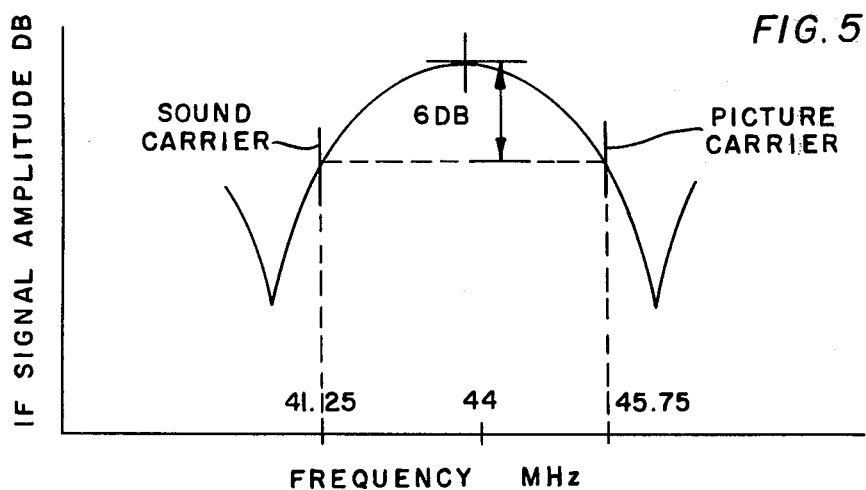
FIG. 5 shows the output response of the IF amplifier as a function of frequency, illustrating the effect of detuning the AFT circuit to strengthen the picture carrier signal.

With reference to FIG. 5, it is seen that the picture carrier signal normally is set at a frequency of 45.75 MHz. As a result, if the tuner 16 is normally tuned, a predetermined amplitude is derived from the IF amplifier 18 as indicated in FIG. 5, which is 6 dB down from that signal. Thus, where the RF signal is weak, as would be received from a distant station, it is desired to close switch S3 and to variably set the potentiometer 36 until the desired degree of detuning of the AFT circuit 20 is achieved. The effect of such adjustment is illustrated in FIG. 5, where it can be seen that if the tuning of the picture carrier is shifted to the left, the amplitude of the picture carrier is increased toward a maximum, achieved at 44 MHz, due to the characteristics of the IF amplifier 18. In this manner, the video picture signal will have a decreased high-frequency response and a boosted low-frequency response, and thus the resultant image displayed by the CRT 76 is improved, due to the reduction of the high-frequency noise signals.

Figure 4B:
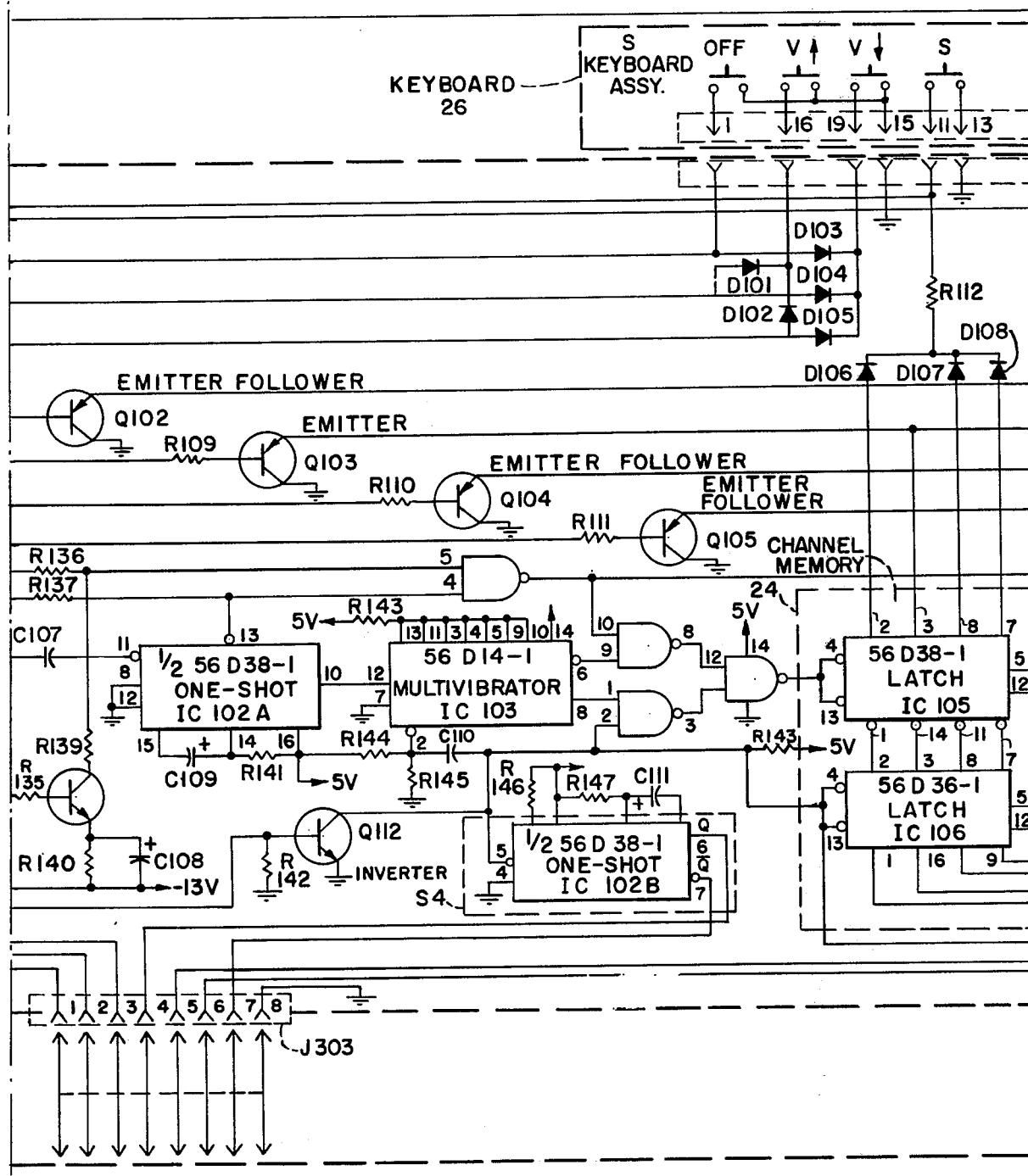
Figure 4C:
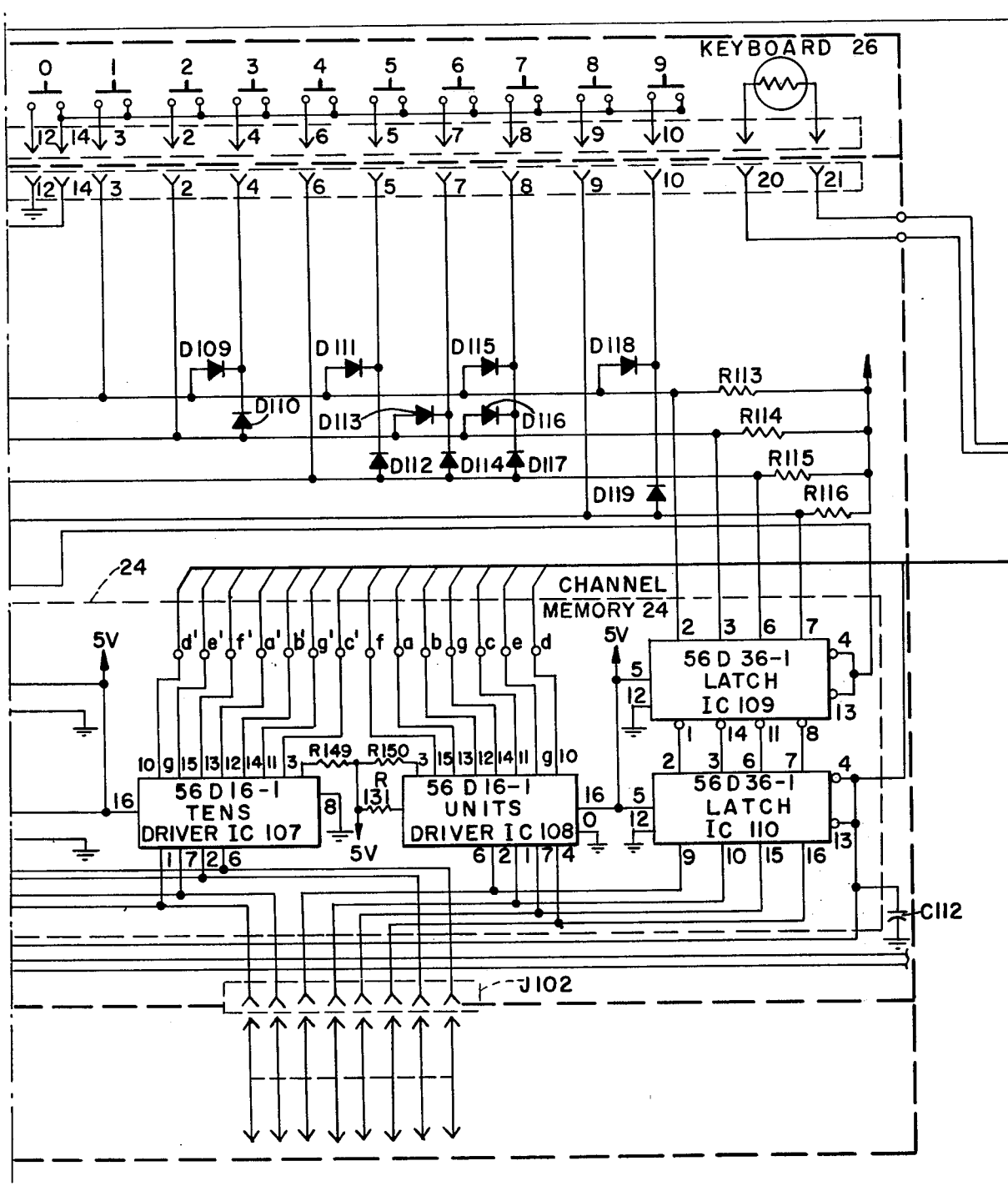
Figure 4D:
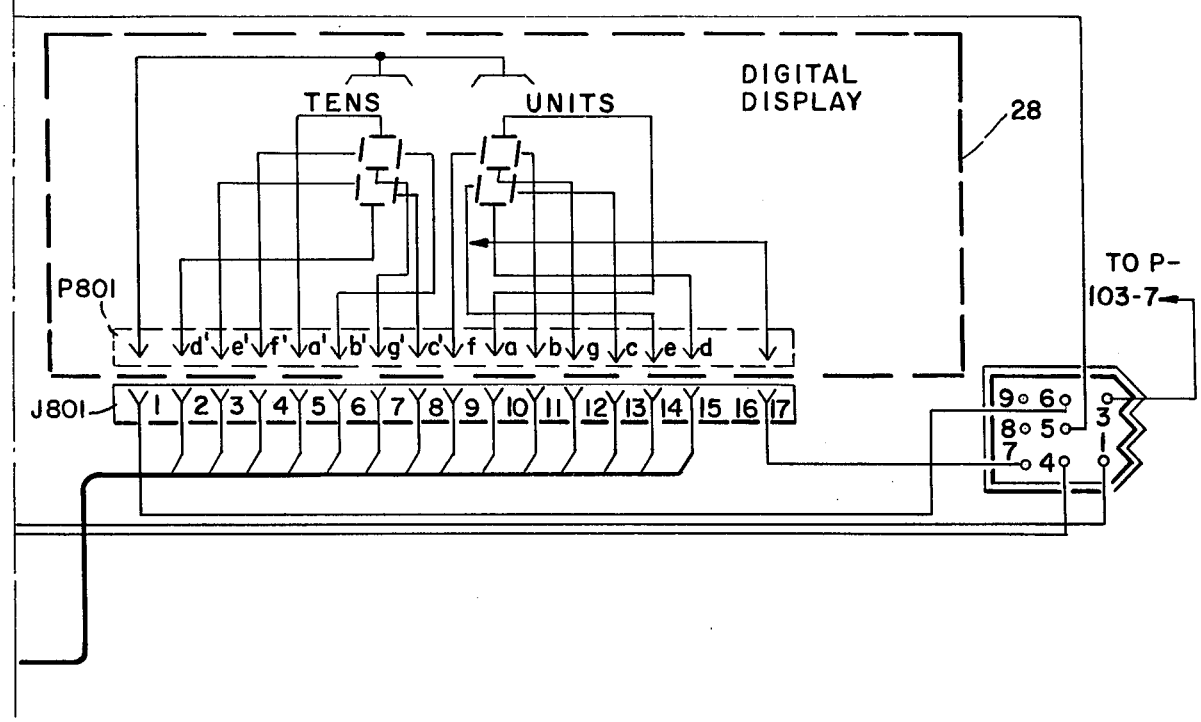

Referring now to FIGS. 4A–4H, there is shown an illustrative, preferred embodiment of this invention, wherein the circuit elements or modules forming the block diagrams of the logic circuit 60 and the synthesizer circuit 50 are shown in detail. In particular, the circuit elements and structure of the logic circuit 60 comprised of the keyboard 26, the channel memory 24 and the display 28, are outlined in dotted line and specifically identified with corresponding numerals, as seen in FIGS. 4A–4D. In particular, as seen in FIGS. 4B and 4C, the channel memory 24 includes a plurality of latches IC105, IC106, IC109 and IC110, and first and second drivers IC107 and IC108. When the viewer presses one of the push-buttons 0 to 9 on the keyboard 26, a circuit is completed through a matrix comprised of diodes D101 to D119, whereby an appropriate, digitalized value is applied to one of the latches IC105, IC106, IC109 and IC110 to be stored therein. The stored value of the entered number indicative of the channel to be tuned, is applied to the programmable divider 14 and also by way of the tens driver IC107 and units driver IC108 to the digital display 28 (see FIG. 4D). As will be evident from a review of FIGS. 4A–4H, each of the block diagrams, such as the latch IC105, is identified with a module number, e.g. 56D361 for latch IC105, which identifies an IC module number of the Admiral Corporation, assignee of this invention.

Figure 4E:
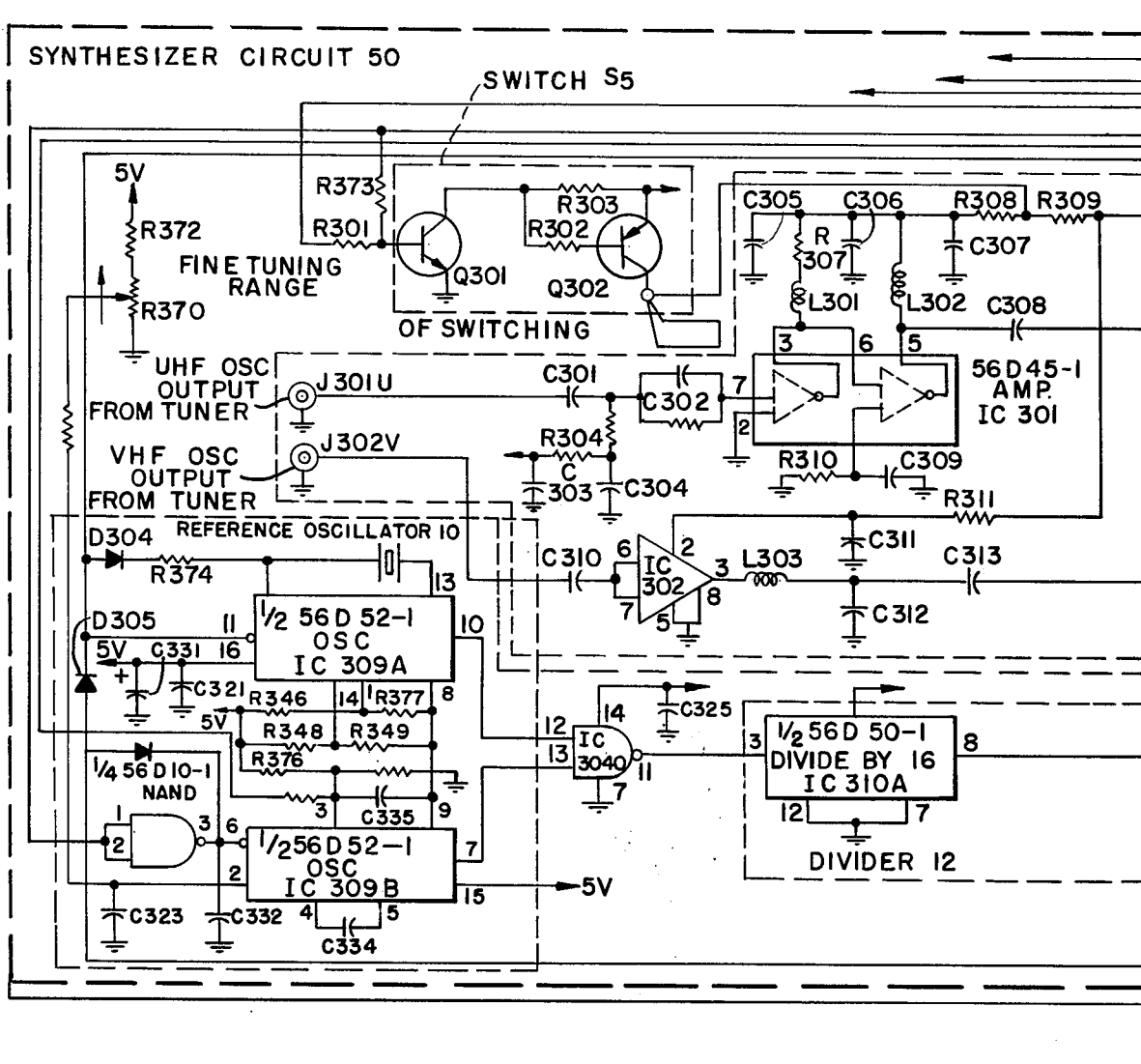
Figure 4F:
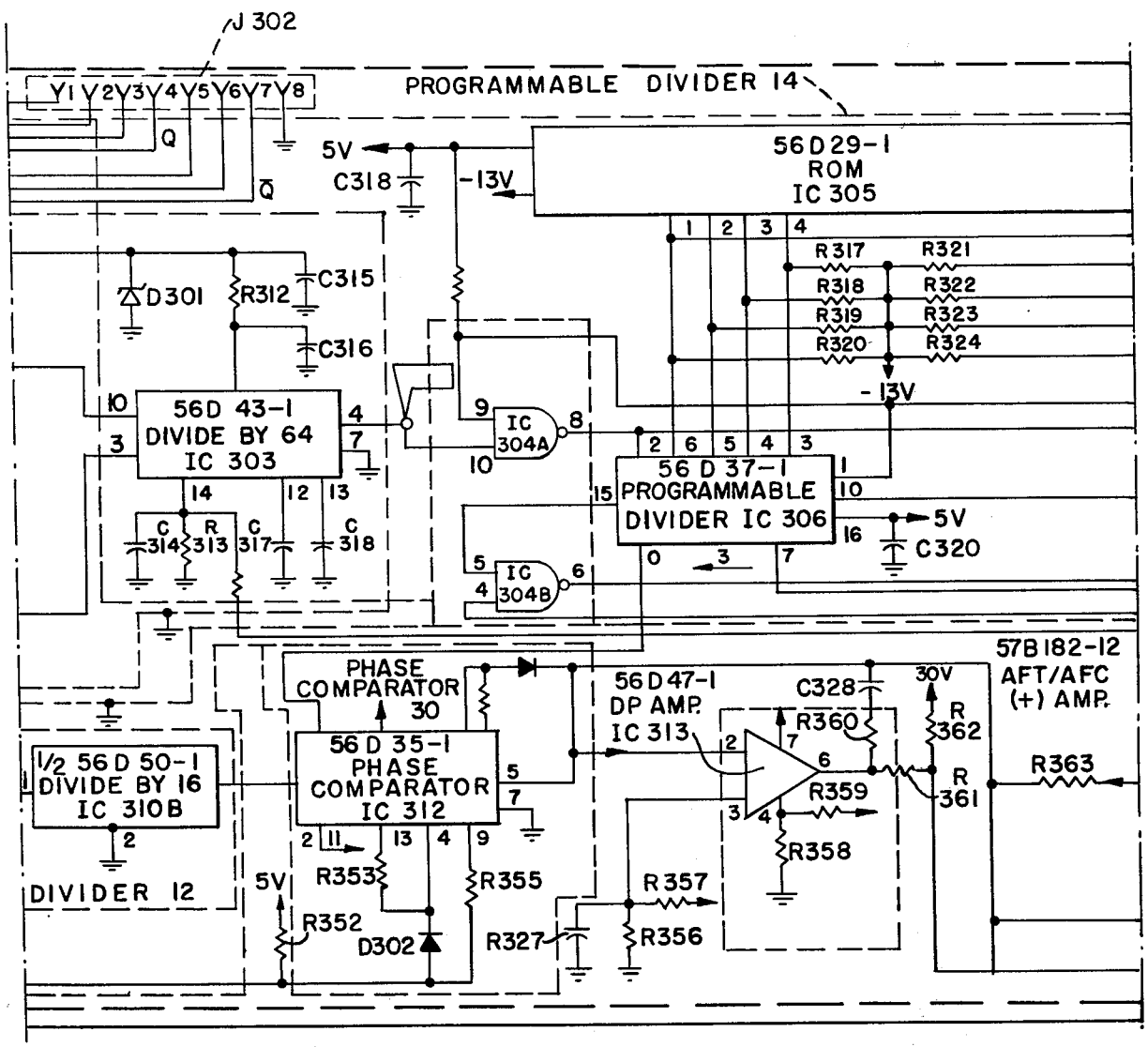
Figure 4G:
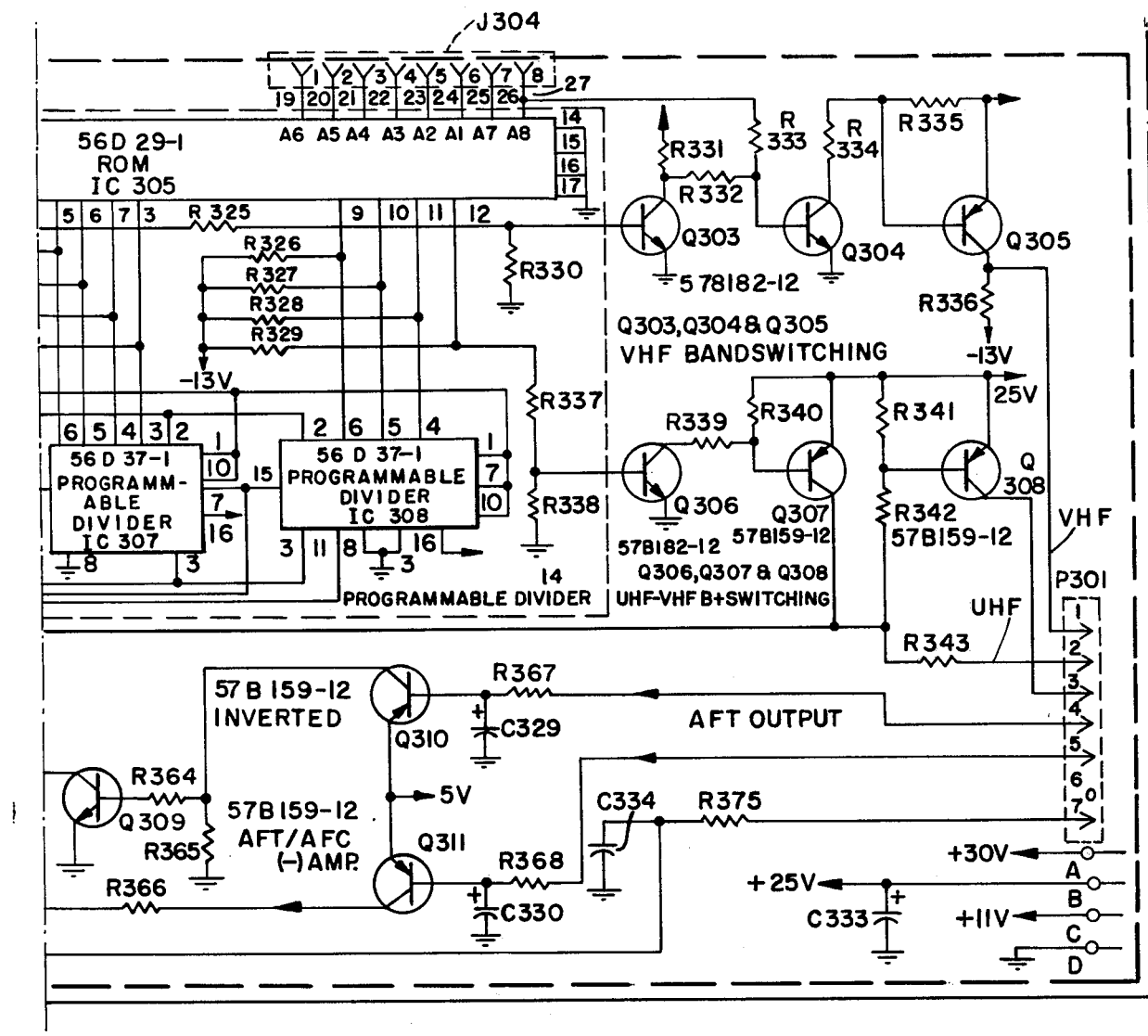

Further, there is illustrated in FIGS. 4E–4H, the detailed, preferred embodiment of the synthesizer circuit 50, wherein the detailed circuit elements and modules of the programmable divider 14, the phase comparator 30, the divider 12 and the reference oscillator 10 are identified and shown. In particular, the reference oscillator 10 (see FIG. 4E) is illustrated as comprising IC modules 309A and 309B, whose output is applied to the divider 12 comprised of IC modules 310A (see FIG. 4E) and 310B (see FIG. 4F). The output of the divider 12 is compared by the phase comparator 30 (see FIG. 4F), comprised of a phase comparator module IC312. As particularly illustrated in FIGS. 4B and 4C, the stored value of the selected channel as derived from the latches IC106 and IC110, are applied to the programmable divider 14 through its ROM IC305 via terminals A1–A8 of connectors J102 and J304, as shown in FIGS. 4F and 4G. In operation, the ROM IC305 converts the digital signal applied thereto to a set of control signals to be applied to a plurality of programmable dividers IC306, IC307 and IC308, which function in response to such control signals to divide selectively an output as received from the tuner 16 and in particular its local oscillator 66 (see FIG. 1) by a selected factor.

The local oscillator 66 of each of the VHF tuners 16a and UHF tuners 16b (see FIG. 4H) is applied through input terminals J302V and J301U, respectively, to the synthesizer circuit 50 as shown in FIG. 4E, to be subsequently amplified by amplifiers IC302 and IC301, respectively, before being applied to the programmable divider 14 and in particular to its divider IC303 (see FIG. 4F), which divides the tuner's oscillating signals by a fixed factor, illustratively 64. Thereafter, the divided reference signals are applied to three programmable dividers IC306, IC307 and IC308 (see FIGS. 4F and 4G) that are parallel-encoded by the outputs of the ROM IC305 to divide the tuner oscillator signals by a selected factor or modulus.

As seen in FIG. 4E, the reference oscillator 10 comprises a 4 MHz crystal controlled oscillator circuit IC309a, its output being divided illustratively by a factor of 256 by dividers IC310A (see FIG. 4E) and IC310B (see FIG. 4F). The output of the programmable dividers IC306, IC307 and IC308 (see FIGS. 4F and 4G) is mixed or phase-compared to the output of the reference oscillator 10 by the phase comparator 30 (see FIG. 4F), comprised of the phase comparator chip IC312. The phase comparator IC312 comprises a transistor acting as a charge pump or current source that produces a differential output to the voltage integrator in the form of an operational integrator IC313. The differential output is converted via the voltage integrator IC313 to a higher DC output level, which in turn is applied via resistors R361 (see FIG. 4F) and R375 (see FIG. 4G), terminals 7 of the connectors P301 and J301, to the tune inputs of the VHF tuner 16a and the UHF tuner 16b (see FIG. 4H).

The selection of which of the UHF or VHF tuners 16a and 16b to be operated is derived from the encoded output of the ROM IC305 (see FIG. 4G). In particular, the output of pin 12 of the ROM IC305 is applied via transistors Q306, Q307 and Q308, terminals 3 of connector P301, to effect actuation of the VHF tuner 16a. Similarly, the output derived from pin 1 of the ROM IC305 is applied via transistors Q303, Q304 and Q305 via terminal 1 of connectors P301 and J301 to effect a switching between the high and low VHF bands.

As mentioned above, the switches S1, S2, S4 and S5 of FIG. 2 take the form, in a preferred, illustrative embodiment of this invention, of electronic switches and are identifiable in FIGS. 4A-4H. In particular, the functions of the switches S2 and S1 are performed by the voltage integrator IC313 and the subsequent resistor R363, as seen in FIG. 4F. In particular, during an initial period of operation, the output of the phase comparator 30, having a realtively low impedance, is connected via the integrator IC313 to the tuner 16. After the expiration of the initial operating period, an output is derived from the AFT circuit 20 and applied to an input pin 2 of the integrator IC313 as shown in FIG. 4F, through terminals 5 and 6 of the connectors P301 and J301 (see FIG. 4G), through an inverter Q310 and an amplifier Q311, transistor Q309 and high impedance R363 (see FIG. 4F), typically of a value of 10 M ohms. Thus, the AFT output signal is applied via a relatively high impedance and has only an effective presence as an input to the integrator IC313 in the absence of the output of the phase comparator 30, which presents a much lower input impedance to the integrator IC313. Thus, due to the relative impedances of the outputs applied to the voltage integrator IC313, the phase comparator 30 acts as a switch during the initial period, to apply the output of the phase comparator 30 to the tuner 16 via the integrator IC313, and thereafter applies the processed AFT signal to the tuner 16 to maintain a tuning voltage applied thereto.

In operation, one of the buttons of the keyboard 26, e.g. button 2, is pushed to begin operation. In turn, the selected switch provides an output to a matrix comprised of diodes D101 to D119 (see FIGS. 4B and 4C) to provide a BCD signal in digital form to the plurality of latches IC105, IC106, IC109 and IC110, such that the output of the latches IC106 and IC110 drives the ROM IC305 and the display decoder drivers IC107 and IC108. The outputs of the latches IC106 and IC110 are in a BCD format, with eight-bit words addressing the ROM IC305 and the decoder drivers IC107 and IC108.

Further, the activation of the select button S provides an output via the transistor inverter Q112 before being applied to a one-shot multivibrator circuit IC102b. As shown in FIG. 4B, the one-shot multivibrator circuit IC102b forms the electronic switch S4, whereby the power supply 34c, as shown in FIG. 2, is applied to the programmable divider 14. In particular, the one-shot multivibrator circuit IC102b is actuated by the depression of the select button S of the keyboard 26 to provide for the predetermined, initial operating period, e.g. 300 ms, as derived from the Q output of the circuit IC102b, via pins 4 of the connectors J101 and J303 to actuate an electronic switch S5 comprised of transistors Q301 and Q302 (see FIG. 4E), whereby power is applied to the programmable divider 14. Further, the output of inverter transistor Q112 (see FIG. 4B) is applied to latches IC106 and IC110 to effect the shift of the stored signal indicative of the selected channel from latches IC105 and IC109 (see FIGS. 4B and 4C), to latches IC106 and IC110, which in turn drives drivers IC107 and IC108 to provide signals to the digital display 28 and the programmable divider 14.

In remote operation, as seen in FIG. 4A, a remote control signal is applied to the receiver decoder IC101 via the transistor amplifier Q101, not a part of the invention described herein. The receiver diode IC101 decodes the remote control signals with a clock signal derived from a reference oscillator 59, to provide an output at its pins 7, 12, 11, 9 and 8, to be applied to the latches IC105 and IC109 (see FIGS. 4B and 4C) of the channel memory 24 to set the variable factor therein in a manner similar to that described above. Further, an output of decoder IC101 from its pin 6 actuates one-shot IC111 (see FIG. 4A) to apply a delayed signal via transistor Q119 and inverter Q112 to actuate one-shot IC102B (see FIG. 4B), which in turn provides a controlled pulse of a duration corresponding to the initial period of operation. The decoder IC101 further provides an output from its pin 6 to actuate a one-shot IC111, to provide a signal via inverter transistor Q112 to actuate one-shot IC102B to provide the initial control pulse signal as explained above, and also to provide a shift signal to the latches IC106 and IC110, as also explained above.

Figure 3:
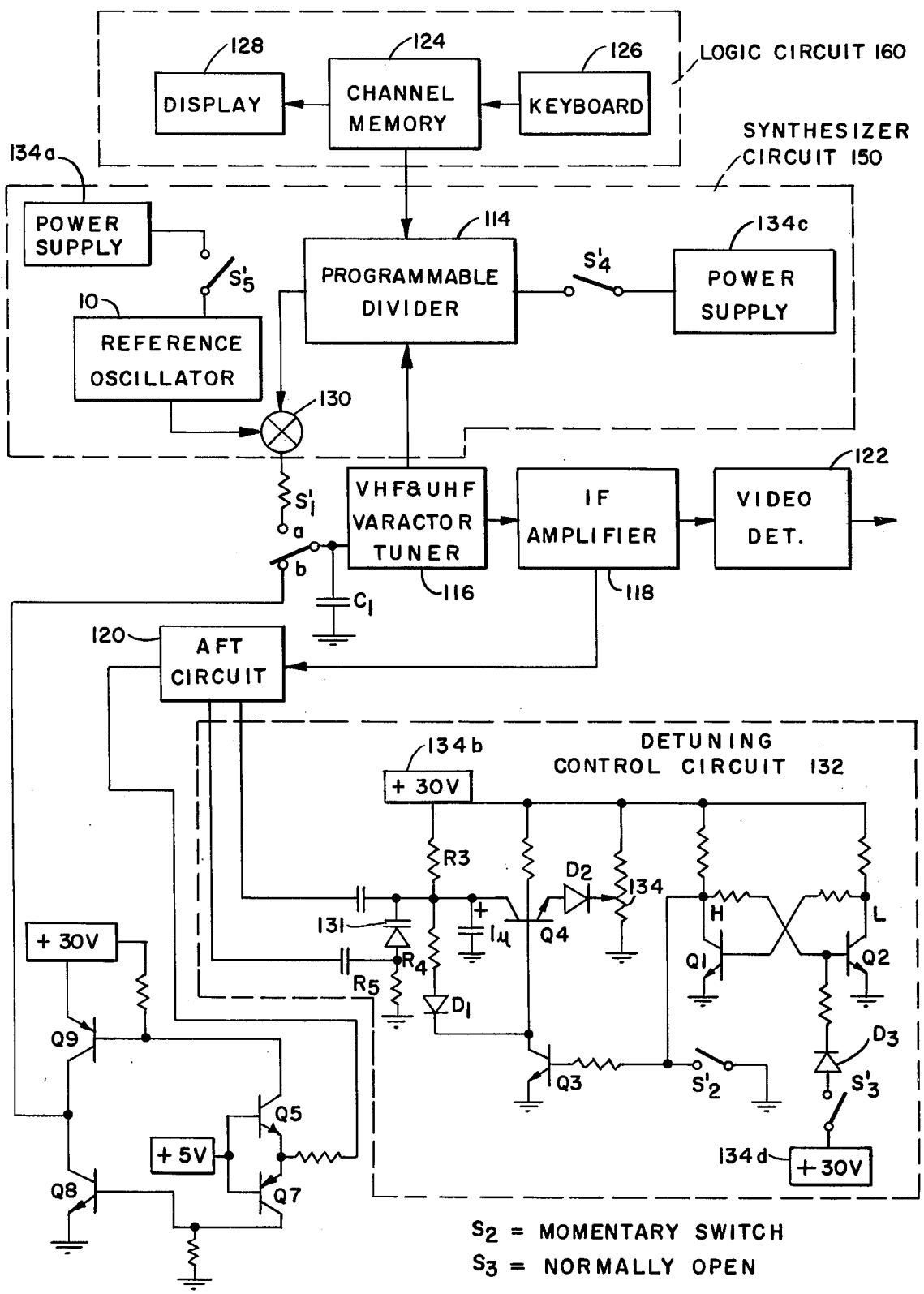
FIG. 3 shows the varactor-type tuner, the synthesizer circuit, and a further specific, illustrative embodiment of the detuning control circuit.

Referring now to FIG. 3, there is shown a further, alternative embodiment of the detuning control circuit in accordance with the teachings of this invention. As seen in FIG. 3, many of the same elements as shown in FIG. 2 are incorporated therein, but are referenced with numerals in the 100's series. The tuning circuitry of the AFT circuit 120 is capacitively coupled in-parallel with a varactor diode 131, connected at one terminal through a resistor R3 to a power supply 134b and connected through a second resistor R5 to ground. The control circuit associated with the varactor diode 131 comprises a transistor Q4 whose collector is connected to the first terminal of the varactor diode 131 and whose emitter is connected via a diode D2 to a variable tap of a potentiometer 134. The base of the transistor Q4 is connected via the collector-emitter circuit of transistor Q3 to ground. In turn, the base of transistor Q3 is connected to a differentially-connected pair of transistors Q1 and Q2. The point of interconnection between the base of transistor Q3 and the collector of transistor Q1 is connected by switch S'2 to ground, and the base of transistor Q2 is connected via a resistor, a diode D3 and a switch S'3 to a power supply 134d. The collector of transistor Q3 is connected to the collector of transistor Q4 via diode D1 and resistor R4.

In the normal, non-detuning operation of the detuning control circuit 132, the transistor Q1 is turned off and the transistor Q2 is turned on, whereby the switch S'2 remains open and switch S'3 is momentarily closed so that transistor Q3 is disposed in its conductive state and the voltage of power supply 134b is divided essentially across resistors R3 and R4, since the transistor Q4 is non-conductive. Thus, a known voltage appearing at the point of interconnection therebetween is applied to the first terminal of the varactor diode 131 to fix the capacitance of varactor diode 131 to a known capacitance such that the AFT circuit 120 is tuned to a frequency of essentially 45.75 MHz.

In order to actuate the detuning control circuit 132 to its detuning mode of operation, the switch S'2 is closed, switch S'2 being a momentary switch in that it effects closure for only a relatively short period of time. As a result, transistor Q1 is rendered conductive and transistor Q2 is rendered non-conductive, whereby transistor Q3 is rendered non-conductive and transistor Q4 is turned on. As a result, the potential as developed at the tap of the variable potentiometer 134 is applied via the conductive transistor Q4 and the diode D2 to set a new voltage on the varactor diode 131, whereby its capacitance is changed so that the tuning of the AFT circuit 120 may be varied, and the amplitude of the picture carrier signal in the IF amplifier 118 is varied, as explained above. In turn, the output of the AFT circuit 120 is applied by a differential circuit comprised of transistors Q5, Q7, Q8 and Q9, which adjustably amplify the DC level of the AFT circuit 120 to provide an appropriate DC level of the tuning voltage to the VHF, UHF varactor tuner 116.

Thus, there has been shown a television receiver comprising a new combination of a varactor-type tuner and synthesizer, whereby the problems of high-frequency radiation due to the incorporation of adjustable or programmable dividers is overcome in that the synthesizer portion of the tuning circuit is only initially coupled with the varactor-type tuner to set initially its tuning voltage and thereafter is disconnected and the programmable dividers deactuated. Further, there is provided a detuning control circuit, whereby the automatic fine-tuning circuit associated with the tuner is slightly detuned, so that the picture carrier signal strength is increased to improve the television display of relatively weak signals as would be received from distant stations.

Numerous changes may be made in the above-described apparatus and the different embodiments of the invention may be made without departing from the spirit thereof; therefore, it is intended that all matter contained in the foregoing description and in the accompanying drawings shall be interpreted as illustrative and not in a limiting sense.

What is claimed is:

1. In a television receiver, channel selecting apparatus comprising:
    (a) tuning means including a varactor tuning element, a local oscillator and a mixer having a first input from said local oscillator and a second input to which an RF video signal is applied;
    (b) synthesizer means for providing a first tuning signal said synthesizer means emanating while operative undesireable high frequency radiations, said synthesizer means including:
        (1) means for setting a TV channel to be tuned by said tuning means;
        (2) variable divider means adapted to be selectively actuated to receive and variably divide the local oscillator output in accordance with a factor corresponding to the channel selected by said setting means;
        (3) means for providing a reference signal; and
        (4) means for comparing the reference signal with the output of said variable divider means and adapted to be selectively coupled to said tuning means to provide the first tuning signal to be applied thereto;
    (c) source means to be selectively coupled to said tuning means for providing a second tuning signal thereto; and
    (d) control means operative for a relatively short, initial period for energizing said synthesizer means and for coupling said synthesizer means to apply the first tuning signal to said tuning means, and thereafter for de-energizing said variable divider means and said reference signal means of said synthesizer means, whereby the high frequency radiation emanating therefrom is terminated, and decoupling said synthesizer means from said tuning means, while coupling said source means to apply the second tuning signal to said tuning means.

2. Channel selecting apparatus as claimed in claim 1, wherein said source means comprises an automatic fine-tuning circuit responsive to the output of said tuning means for providing the second tuning signal.

3. Channel selecting apparatus as claimed in claim 1, wherein there is further included memory means coupled to said setting means for storing a signal indicative of the selected TV channel.

4. Channel selecting apparatus as claimed in claim 3, wherein there is further included display means coupled to said memory means for displaying visually the selected TV channel.

5. Channel selecting apparatus as claimed in claim 3, wherein said variable divider means comprises a variable divider circuit and a read-only memory responsive to the signal indicative of the selected channel stored in said memory means for providing and applying a signal indicative of a selected multiplication factor to said variable divider circuit to set a corresponding factor by which said variable divider circuit divides the local oscillator output signal.

6. Channel selecting apparatus as claimed in claim 1, wherein said reference signal means comprises a reference oscillator circuit for providing the reference signal to said means for comparing.

7. Channel selecting apparatus as claimed in claim 1, wherein said source means comprises an automatic fine-tuning circuit responsive to the output of said tuning means for varying its second tuning output signal to maintain the tuning frequency of said tuning means, and detuning means for adjustably detuning said automatic fine-tuning circuit.

8. Channel selecting apparatus as claimed in claim 7, wherein said detuning means comprises a varactor element having a variable capacitance, and control means for applying a variable D.C. voltage to said varactor element whereby its capacitance is adjusted to vary thereby the tuning of said automatic fine-tuning circuit.

9. Channel selecting apparatus as claimed in claim 7, wherein there is further included IF amplifier means for amplifying the output of said tuning means, said IF amplifier means having the characteristic that the detuning of said automatic fine-tuning circuit and the subsequent change of frequency tuned by said tuning means effects the corresponding change in the amplitude of the IF amplifier means output.

10. Channel selecting apparatus as claimed in claim 9, wherein said detuning means includes a varactor element and means for placing a selected voltage across said varactor element, whereby the capacitance of said varactor element is selected to provide the desired degree of detuning within said automatic fine-tuning circuit.

11. In a television receiver, channel selecting apparatus comprising:
   (a) tuning means including a varactor tuning element, a local oscillator and a mixer having a first input from said local oscillator and a second input to which an RF video signal is applied;
   (b) synthesizer means for providing a first tuning signal including:
      (1) means for setting a TV channel to be tuned by said tuning means;
      (2) variable divider means adapted to be selectively actuated to receive and variably divide the local oscillator output in accordance with a factor corresponding to the channel selected by said setting means;
      (3) means for providing a reference signal; and
      (4) means for comparing the reference signal with the output of said variable divider means and adapted to be selectively coupled to said tuning means to provide the first tuning signal to be applied thereto;
   (c) an automatic fine-tuning circuit responsive to the output of said tuning means for providing a second tuning signal; and
   (d) control means operative for a relatively short, initial period for energizing said synthesizer means and for coupling said synthesizer means to apply the first tuning signal to said tuning means, and thereafter for de-energizing said variable divider means and said reference signal means of said synthesizer means, whereby the high frequency radiation emanating therefrom is terminated, and decoupling said synthesizer means from said tuning means, while coupling said automatic fine-tuning circuit means to apply the second tuning signal to said tuning means.

* * * * *

UNITED STATES PATENT AND TRADEMARK OFFICE
CERTIFICATE OF CORRECTION

PATENT NO. : 4,128,849
DATED : December 5, 1978
INVENTOR(S) : Dennis W. Rhee

It is certified that error appears in the above—identified patent and that said Letters Patent are hereby corrected as shown below:

Claim 11, column 11, line 8, after "signal" insert --said synthesizer means emanating while operative undesireable high frequency radiations, said synthesizer means--

Signed and Sealed this

Third Day of April 1979

[SEAL]

Attest:

RUTH C. MASON
Attesting Officer

DONALD W. BANNER
Commissioner of Patents and Trademarks